United States Patent
Rakshit et al.

(10) Patent No.: US 10,679,688 B2
(45) Date of Patent: Jun. 9, 2020

(54) FERROELECTRIC-BASED MEMORY CELL USABLE IN ON-LOGIC CHIP MEMORY

(71) Applicant: Samsung Electronics Co., LTD., Gyeonggi-do (KR)

(72) Inventors: Titash Rakshit, Austin, TX (US); Borna J. Obradovic, Leander, TX (US); Ryan M. Hatcher, Austin, TX (US); Jorge A. Kittl, Austin, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/142,954

(22) Filed: Sep. 26, 2018

(65) Prior Publication Data
US 2019/0318775 A1 Oct. 17, 2019

Related U.S. Application Data

(60) Provisional application No. 62/658,545, filed on Apr. 16, 2018.

(51) Int. Cl.
*G11C 11/22* (2006.01)
*H01L 27/11585* (2017.01)
*H01L 27/11502* (2017.01)

(52) U.S. Cl.
CPC .......... *G11C 11/221* (2013.01); *G11C 11/223* (2013.01); *G11C 11/2259* (2013.01);
(Continued)

(58) Field of Classification Search
CPC . G11C 11/221; G11C 11/223; G11C 11/2259; G11C 11/2273; G11C 11/2275; H01L 27/11502; H01L 27/11585
(Continued)

(56) References Cited

U.S. PATENT DOCUMENTS

| 5,424,975 A | 6/1995 | Lowrey |
| 6,044,034 A | 3/2000 | Katakura |

(Continued)

FOREIGN PATENT DOCUMENTS

WO 2005015653 A1 2/2005

OTHER PUBLICATIONS

Mulaosmanovic, Switching Kinetics in Nanoscale Hafnium Oxide Based Ferroelectic Field-Effect Transistors, 2017 American Chemical Society, ACS Appl. Mater. Interfaces 2017, 9, Jan. 10, 2017, pp. 3792-3798.

(Continued)

*Primary Examiner* — Fernando Hidalgo
(74) *Attorney, Agent, or Firm* — Van Pelt, Yi & James LLP

(57) ABSTRACT

A memory cell and method for utilizing the memory cell are described. The memory cell includes at least one ferroelectric transistor (FE-transistor) and at least one selection transistor coupled with the FE-transistor. An FE-transistor includes a transistor and a ferroelectric capacitor for storing data. The ferroelectric capacitor includes ferroelectric material(s). In some aspects, the memory cell consists of a FE-transistor and a selection transistor. In some aspects, the transistor of the FE-transistor includes a source, a drain and a gate coupled with the ferroelectric capacitor. In this aspect, the selection transistor includes a selection transistor source, a selection transistor drain and a selection transistor gate. In this aspect, a write port of the memory cell is the selection transistor source or the selection transistor drain. The other of the selection transistor source and drain is coupled to the ferroelectric capacitor.

20 Claims, 3 Drawing Sheets

(52) U.S. Cl.
CPC ...... *G11C 11/2273* (2013.01); *G11C 11/2275* (2013.01); *H01L 27/11502* (2013.01); *H01L 27/11585* (2013.01)

(58) Field of Classification Search
USPC .......................................................... 365/145
See application file for complete search history.

(56) References Cited

U.S. PATENT DOCUMENTS

| | | | |
|---|---|---|---|
| 6,341,082 B2 | 1/2002 | Hosoi | |
| 6,744,087 B2 | 6/2004 | Misewich | |
| 7,643,326 B2 | 1/2010 | Kang | |
| 7,848,131 B2 | 12/2010 | Kim | |
| 9,070,575 B2 * | 6/2015 | Summerfelt | ...... H01L 27/11507 |
| 9,368,182 B2 | 6/2016 | Mueller | |
| 9,773,794 B2 * | 9/2017 | Sashida | ............. H01L 27/11507 |
| 9,830,990 B2 | 11/2017 | Izumi | |
| 9,899,085 B1 * | 2/2018 | Yan | ..................... G11C 14/0072 |
| 2015/0028451 A1 * | 1/2015 | Watanabe | ........... G06F 17/5068 257/532 |
| 2018/0122478 A1 * | 5/2018 | Morris | ................. G11C 11/2273 |
| 2018/0166448 A1 * | 6/2018 | Cheng | ................... G11C 11/401 |
| 2018/0182763 A1 * | 6/2018 | Juengling | ............. H01L 29/785 |
| 2018/0350800 A1 * | 12/2018 | Chang | ............... H01L 29/78391 |

OTHER PUBLICATIONS

Muller et al., Nanosecond Polarization Switching and Long Retention in a Novel MFIS-FET Based on Ferroelectic HfO2, IEEE 2012, IEEE Electron Device Letters, vol. 33, No. 2, Feb. 2012.

Obradovic et al., Ferroelectic Switching Delay as Cause of Negative Capacitance and the Implications to NCFETs, 2018 IEEE Symposium on VLSI Technology, IEEE 2018, Jun. 18-22, 2018.

Schroeder et al., All-Organic Permanent Memory Transistor Using an Amorphous, Spin-Cast Ferroelectric-like Gate Insulator, Advanced Materials , 2004, 16, No. 7, Apr. 5, 2004.

Schroeder et al., Memory Performance and Retention of an All-Organic Ferroelectric-Like Memory Transistor, IEEE Electron Device Letters, vol. 26, No. 2, Feb. 2005, pp. 69-71.

Sun et al., High-Performance Polymer Semiconductor-Based Nonvolatile Memory Cells with Nondestructive Read-Out, The Journal of Physical Chemistry, Oct. 6, 2017, pp. 1-15.

Wu et al., High-Performance Organic Transistor Memory Elements with Steep Flanks of Hysteresis, Advanced Functional Materials, 2008, 18, pp. 2593-2601.

Aoki et al., Nitride Passivation Reduces Interfacial Traps in Atomic-Layer-Deposited in A1203/GaAs (001) Metal-Dxide-Semiconductor Capacitors Using Atmospheric Metal-Organic Chemical Vapor Deposition, Applied Physics Letters 105, 2014.

Bessolov et al., Chalcogenide Passivation of 111-V Semiconductor Surfaces, Semiconductors, 1998 American Institute of Physics, vol. 32, No. 11, Nov. 1998.

Brammertz et al., Electrical Properties of III-V/Oxide Interfaces, ECS Transactions, 19 (5) pp. 375-386, 2009.

Chang et al., Impact of La2O3 Interfacial Layers on InGaAs Metal-Oxide-Semiconductor Interface Properties in Al2O3/La2O3/InGaAs Gate Stacks Deposited by Atomic-Layer-Deposition, Journal of Applied Physics 118, 2015.

Chau et al., Integrated Nanoelectronics for the Future, 2007 Nature Publishing Group, Nature Materials , vol. 6, Nov. 2007.

Hatcher et al., A Comparison of the Carrier Density at the Surface of Quantum Wells for Different Crystal orientations of Silicon, Gallium Arsenide, and Indium Arsenide, Applied Physics Letters 103, 2013.

Hinkle et al., Detection of Ga Suboxides and their Impact on III-V Passivation and Fermi-Level Pinning, Applied Physics Letters 94, 2009 American Institute of Physics, 2009.

Punkkinen et al., Oxidized In-Containing III-V (100) Surfaces: Formation of Crystalline Oxide Films and Semiconductor-Oxide Interfaces, Physical Review B 83, 2011.

Qin et al., in Situ Surface and Interface Study of Crystalline (3x1)-O on InAs, Applied Physics Letter 109, 2016.

R.M. Wallace, In-Situ Studies of Interfacial Bonding of High-k Dielectrics for CMOS Beyond 22nm, ECS Transactions, 16 (5), pp. 255-271, 2008.

Wang et al., Field-Effect Mobility of InAs Surface Channel nMOSFET with Low Dit Scaled Gate-Stack, IEEE Transactions on Electron Devices, vol. 62, No. 8, Aug. 2015.

Wang et al., Is Interfacial Chemistry Correlated to Gap States for High-k/III-V Interfaces? , Microelectronic Engineering 88, 2011, pp. 1061-1065, available online Apr. 6, 2011.

* cited by examiner

FERROELECTRIC-BASED MEMORY CELL USABLE IN ON-LOGIC CHIP MEMORY

CROSS-REFERENCE TO RELATED APPLICATIONS

This application claims the benefit of provisional Patent Application Ser. No. 62/658,545, filed Apr. 16, 2018, entitled "LOGIC VDD INTEGRABLE DENSE, MULTI-PORT FERROCELL FOR ON-LOGIC CHIP MEMORY", assigned to the assignee of the present application, and incorporated herein by reference.

BACKGROUND

Applications such as neuromorphic computing, graphical analytics and some classical computing paradigms such as central processing units (CPUs) benefit from dense on-chip memory. On-chip memory for such logic chips is typically six transistor (6T) or eight transistor (8T) static random-access memory (SRAM). Such 6T and 8T SRAM include six and eight transistors, respectively, per cell. The 6T and 8T cells consume large areas. This limits the total number of memory cells that can be accommodated on-chip. Other memory, such as denser nonvolatile memory (NVM) elements and dynamic RAM (DRAM) may require high programming voltages or high refresh power. Consequently, such memories may also be difficult to integrate on a logic die.

Accordingly, what is desired are improved memory cells that may be integrated into logic chips.

DETAILED DESCRIPTION OF THE INVENTION

Figure 1A:
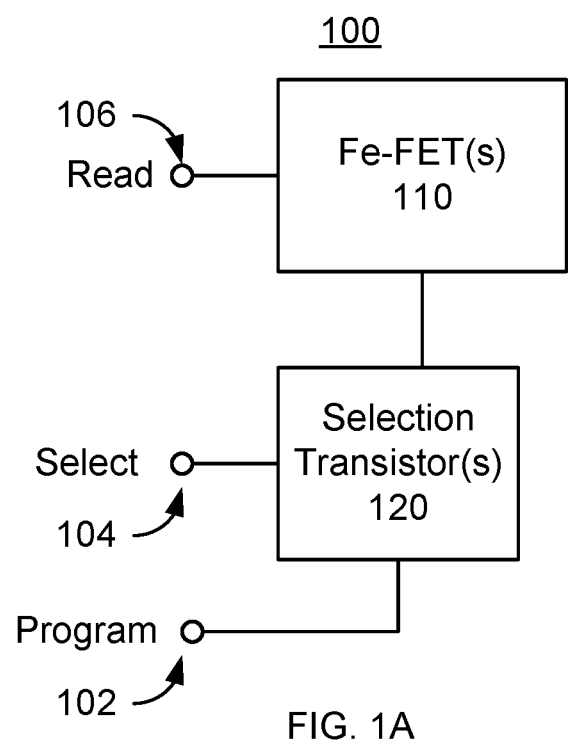
FIGS. 1A and 1B are a block diagram and schematic depicting exemplary embodiments of a memory cell.

The exemplary embodiments relate to memory cells that may be integrated into logic devices and applications in which logic devices are used. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A memory cell and method for utilizing the memory cell are described. The memory cell includes at least one ferroelectric transistor (FE-transistor) and at least one selection transistor coupled with the FE-transistor. An FE-transistor includes a transistor and a ferroelectric capacitor for storing data. The ferroelectric capacitor includes ferroelectric material(s). In some aspects, the memory cell consists of a FE-transistor and a selection transistor. In some aspects, the transistor of the FE-transistor includes a source, a drain and a gate coupled with the ferroelectric capacitor. In this aspect, the selection transistor includes a selection transistor source, a selection transistor drain and a selection transistor gate. In this aspect, a write port of the memory cell is the selection transistor source. The other of the selection transistor source and drain is coupled to the ferroelectric capacitor.

Figure 1B:
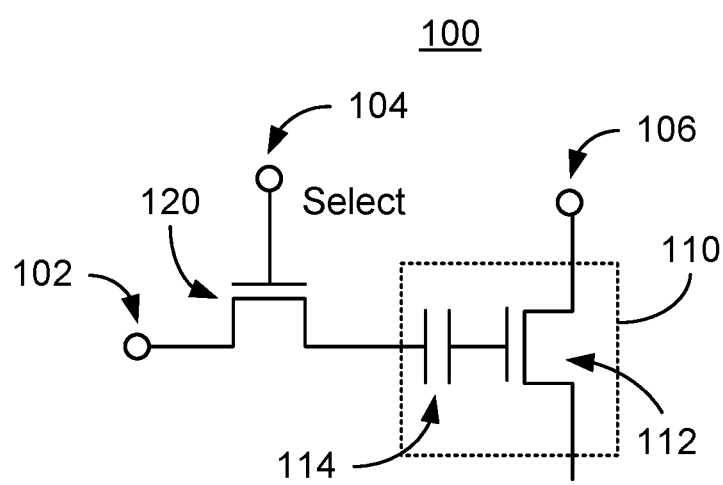

FIGS. 1A and 1B are block and schematic diagrams, respectively, depicting exemplary embodiments of a memory cell 100. Referring to FIG. 1A, the memory cell 100 includes at least one ferroelectric transistor (FE-transistor) 110 and at least one selection transistor 120. In the embodiment shown, the memory cell 100 is a multi-port cell including a write port 102 and a read port 106. Also shown is a selection input 104 used to select the memory cell 100 for programming. In some embodiments, the memory cell may be integrated into a logic die, such as those used in neuromorphic computing, graphical analytics and CPUs. Thus, the memory cells 100 may be used in providing dense on-chip memory and may be programmable using voltages not exceeding logic supply voltages (e.g. 1.8 V).

Referring to FIG. 1B, in some embodiments, a single FE-transistor 110 and a single select transistor 120 are used. Also shown are the write port 102, the selection line input 104 and the read port 106 that are analogous to the components 102, 104 and 106 depicted in FIG. 1A. The selection transistor 120 may be a field effect transistor (FET) and includes a gate, a source and a drain. For example, in various embodiments, the selection transistor 120 may be a planar FET, a finFET, a gate-all-around transistor or have another geometry. In general, the threshold voltage of the selection transistor 120 is desired to be low to provide the lowest voltage drop and highest programming overdrive voltage. Consequently, the selection transistor 120 may be a finFET to allow for higher programming overdrive voltage. The write port 102 corresponds to the source or drain of the selection transistor 120. The other of the source and drain of the selection transistor 120 is coupled with the FE-transistor 110 via ferroelectric capacitor 114 in some embodiments. The selection line input 104 provides the selection voltage to the gate of the selection transistor 120. In an alternate embodiment, the selection transistor 120 might be replaced by another selection device such as a diode.

The FE-transistor includes a transistor 112 and a ferroelectric capacitor 114. In some embodiments, the FE-transistor 110 is a FE-FET. Stated differently, the transistor 112 may be a FET. The geometry of the transistor 112 may be selected based on the desired characteristics. For example, in some embodiments, the transistor 112 is a finFET, such as an NMOS finFET, which may improve subthreshold characteristics, enhanced $I_{on}/I_{off}$ ratios to aid in distinguishing between the on/off states and higher read thresholds. The transistor 112 may also have a thicker gate dielectric to reduce charge leakage and, therefore, increase retention. The effective electrical thickness (as normalized to $SiO_2$) is greater than one nanometer and may be greater than two nanometers in some embodiments. However, a dielectric that is too thick may adversely affect write and read voltages and write and read speeds. Consequently, the dielectric may also be desired to be thin enough such that these characteristics are not adversely affected. The read port 106 may be the source or the drain of the transistor 112.

The ferroelectric capacitor 114 includes at least a ferroelectric material between two electrodes. The ferroelectric capacitor 114 may be a metal-insulator-metal (MIM) capacitor coupled with the gate of the transistor 112. In such embodiments, the gate of the transistor 112 may be separated from the ferroelectric capacitor 114 by an insulating layer. For example, such a ferroelectric capacitor 114 may be between the M0 and M1 layers of a semiconductor device and connected to the gate of the transistor 112 by a direct via or a super via. Consequently, the thermal budget of such a ferroelectric capacitor 114 may be limited by the underlying via and silicide. In other embodiments, the ferroelectric capacitor 114 may be a metal-insulator-semiconductor (MIS) capacitor. In such embodiments, the MIS ferroelectric capacitor 114 may be integrated onto the gate of the transistor 112.

The ferroelectric capacitor 114 includes ferroelectric material(s). In some embodiments, the ferroelectric capacitor 114 may include a dielectric layer and a ferroelectric layer between the electrodes. The ferroelectric material may include at least one of doped $HfO_2$ and/or PbZrTi (PZT). The $HfO_2$ may be doped by Zr, Gd, and/or Si. Additional and/or other ferroelectric materials maybe used. The geometry of the ferroelectric capacitor 114 may be selected based upon the application in which the memory cell 100 is used, the geometry of the transistor 112 and the desired performance of the ferroelectric capacitor 114. For example, in some embodiments, the area of the ferroelectric capacitor 14 may be desired to be not more than $10^4$ $nm^2$. In some such embodiments, the area may be at least $10^2$ $nm^2$ and not more than $10^4$ $nm^2$. Such a range of areas for the ferroelectric capacitor 114 may ensure long pulse width, low voltage switching, which may be desirable. However, other areas may be used. In some embodiments, high temperature anneal(s), for example at temperatures of approximately 1000 C, aid in obtaining the highest number of domains in orthorhombic state, which results in ferroelectricity in doped $HfO_2$ materials.

In operation, the memory cell 100 may be programmed by switching the state of the ferroelectric material(s) in the ferroelectric capacitor 114. Writing to the memory cell 100 may be controlled by the magnitude (the voltage) and width (in time) of the programming pulses used. To write to the memory cell 100, a voltage (e.g. a selection signal) is provided to the gate of the selection transistor 120 cell via the selection input 104. In addition, a program voltage is provided to the write port 102. The source and drain of the transistor 112 may be held at ground during programming. The voltages provided to the selection input 104 and write port 102 may have a magnitude less than or equal to a logic supply voltage if the appropriate pulse width is selected. In some embodiments, multiple pulses are provided to improve the probability that correct writes are performed. In alternate embodiments, however, single pulses might be used. The widths of the pulses may be also configured to modulate and screen out ferroelectric and interface related trapping and detrapping. Pausing on the order of one millisecond after the program/erase pulse(s) may also be used to release trapped charges. Thus, the ferroelectric capacitor 114, and thus the FE-transistor 110, may be written using lower voltages and longer pulse widths. The memory cell 100 may be erased by setting the source and drain of the transistor 112 high while maintaining a low gate voltage. This high voltage may still not exceed the logic supply voltage. Such an erase operation results in the gate voltage for the transistor 112 being less than zero. In some embodiments, the memory cell 100 is erased prior to each programming operation described above.

The polarization change for a ferroelectric capacitor 114 occurs at longer pulse widths for lower magnitude voltages. As such, the polarization of the ferroelectric capacitor 114 may be written/switched at lower voltages, including voltages not exceeding the logic supply voltage, for larger pulse widths. The ferroelectric capacitor 114, and thus the FE-transistor 110, may be written using the pulses described above, programming voltages that do not exceed the logic supply voltage (e.g. 1.8V-2.0V) and longer pulse widths (e.g. at least $10^{-4}$ seconds in some embodiments, at least $10^{-3}$ seconds in some such embodiments, and at least $10^{-2}$ seconds in some embodiments). Although the above is described in the context of a single bit memory cell 100, in an alternate embodiment, a multi-bit implementation is possible. For example, three levels may be used for storing ternary weights in neuromorphic computing cells. However, a multi-bit embodiment may be limited due to low logic supply voltages and noise constraints.

The memory cell 100 may be read by sampling the read port 106. As indicated previously, the read port 106 may be at the source or drain of the transistor 112. The memory cell 100 may thus be read in a digital or analog manner. Further, the select input 104 and write port 102 may be grounded during a read operation. This may allow the read operation to be performed at a higher noise margin because the gate voltage is not activated. In some embodiments, sense amplifiers (not shown) may be used to boost read signals. Such sense amplifiers may function in a similar to a read in SRAM. Further, because the gate voltage is not activated, the memory cell may be used as a multiport memory cell having separate read 102 and write ports 106. In addition, because the gate of the transistor 112 is not activated during the read, the dynamic power of the read operation may be reduced. Thus, applications that are read heavy may benefit from a significant power reduction.

In an alternate embodiment, the read operation may be performed as pulsed Vg. In such embodiments, the read operation uses shorter pulse widths than the write operation described above. Thus, read operations may not disturb the polarization of the ferroelectric capacitor 114. Consequently, write disturbs may be reduced.

The threshold voltage of the transistor 112 is altered during programming. In some embodiments, the threshold voltage may be proportional to the peak programming voltage. This peak programming voltage may be selected for particular applications and may be changed during run time. In general, the higher peak voltage has a higher read speed at the cost of higher power consumption. In some embodiments, the work function metal used in the transistor 112 may be selected such that the threshold voltage of the transistor 112 when the FE-transistor 110 is programmed is less than the flat band voltage of the transistor 112, which is less than the erased threshold voltage of the transistor 112. In such embodiments, the FE-transistor 110 may have a higher noise margin read. In some embodiments, the threshold voltage of the programmed FE-transistor 110 is less than the erased threshold voltage of the FE-transistor 110.

Thus, the memory cell 100 and more particularly the FE-transistor 110 may be programmed using lower voltages and longer pulse widths. Because the memory cell 100 uses only two elements 110 and 120, the memory cell 100 may occupy less space, allowing for denser memory. In some embodiments, the program voltages may have a magnitude that does not exceed the logic supply voltage. Thus, the memory cell 100 may be used for on-die memory in logic devices. Further, the memory cell 100 may use no or fewer level shifters for programming. The memory cell 100 may also be operated (e.g. programmed and erased) using only non-negative voltages, which may be desirable in various applications. The memory cell 100 may thus be used as a quasi-nonvolatile memory element for long retention times, employ multi-port operation, reduce power for read heavy application and use non-negative voltage pulses. The memory cell may also be relatively easily integrable into current CMOS process flows. Thus, operation of a semiconductor device incorporating the memory cell 100 may be improved.

Figure 2:
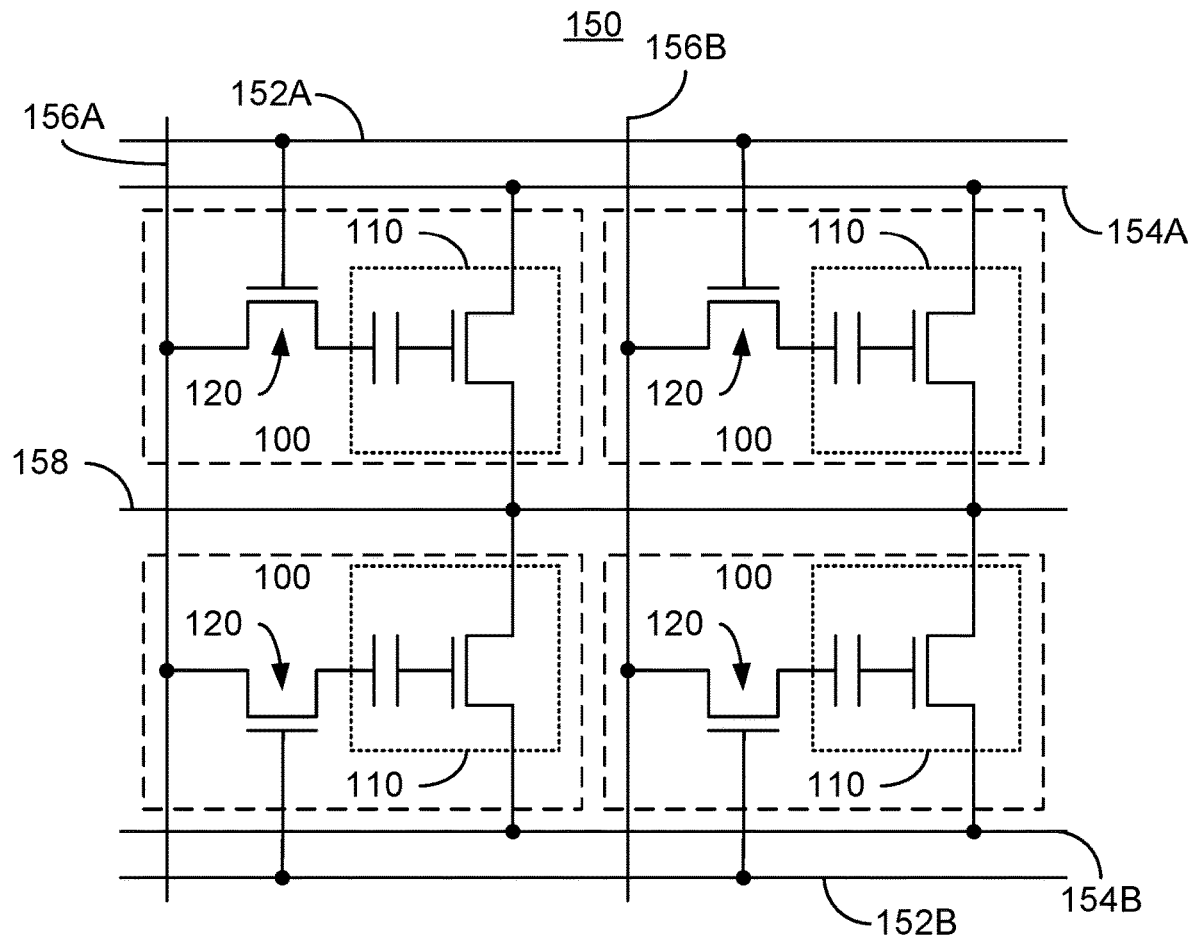
FIG. 2 depicts an exemplary embodiment of an array utilizing the memory cell.

The memory cell 100 can be replicated to make a memory array. FIG. 2 depicts an exemplary embodiment of one such array 150. For simplicity, only a portion of the array is shown. Further, the memory cell 100 may be incorporated into other memory arrays having different components and/or different layouts. Finally, although a particular number of memory cells 100 are shown, an array 150 may include a different number of memory cells 100.

The array 150 might can be used for a logic-on-die cache or other embedded memories. The array includes memory cells 100, select line 152A and 152B, read lines 154A and 154B, write lines 156A and 156B and source lines 158. Select lines 52A and 152B are connected to the gates of the selection transistors 120. Write lines 156A and 156B are coupled to the write ports for the selection transistors 120. Read lines 154A and 154B are coupled to the read port of the FE-transistors 110.

Because the memory cells 100 are used in the array 150, the array 150 may share the benefits of the memory cells 100. The array 150 may be a denser on-die memory, utilize lower programming voltages in combination with longer pulses, and/or may include no or fewer level shifters for programming. The array 150 may also be a quasi-nonvolatile memory element having long retention times, reduced power consumption for read heavy application and may utilize non-negative voltage pulses. Thus, performance of the array may be improved.

Figure 3:
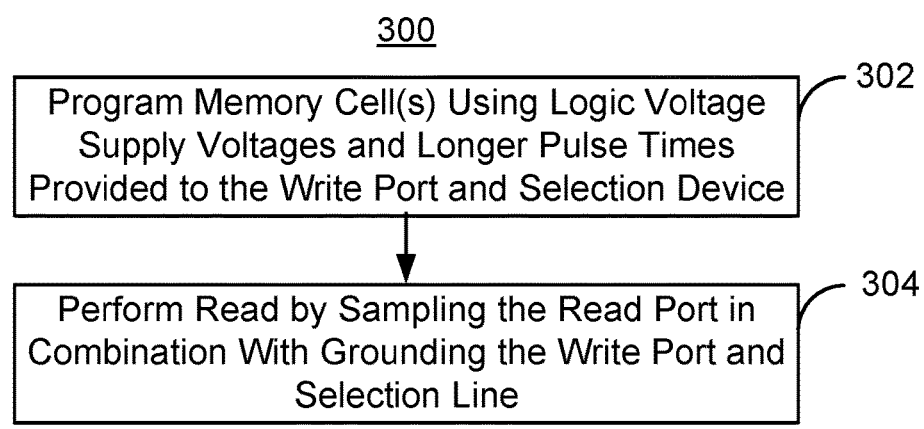
FIG. 3 is a flow chart depicting an exemplary embodiment of a method for operating an exemplary embodiment of the memory cell.

FIG. 3 is a flow chart depicting an exemplary embodiment of a method 300 for operating a computer cell such as the computing cell 100. For simplicity, some steps may be omitted, performed in another order and/or combined. The method 300 is also described in the context of the memory cell(s) 100. However, the method 300 may be used in connection with another memory cell.

The Fe-transistors 110 is programmed, via step 302. Step 302 may be performed as described above. For example, step 302 may include an erase of the memory cell 100 followed by a programming step. The erasure may be accomplished by applying a logical high voltage to the source and drain of the transistor 112 while the write port 102 and select line 104 are grounded. To program the memory cell 100 using a program voltage not exceeding the logic supply voltage, longer width voltage pulses are applied to the write port 102 and the select line 104, as discussed above. In another embodiment, programming may be carried out in another manner.

The memory cell may also be read, via step 304. Although shown as part of the flow 300, the step 302 may be carried out well before and be decoupled from the steps 304. Step 304 may be performed by sampling the read port of the FE-transistor 110 while the select input 104 and write port 102 are grounded. In other embodiments, the read may be performed in another manner.

Thus, using the method 300, the memory cell(s) 100 and/or an analogous device may be used. As a result, one or more of the advantages of the memory cell 100 and/or analogous device may be achieved.

Figure 4:
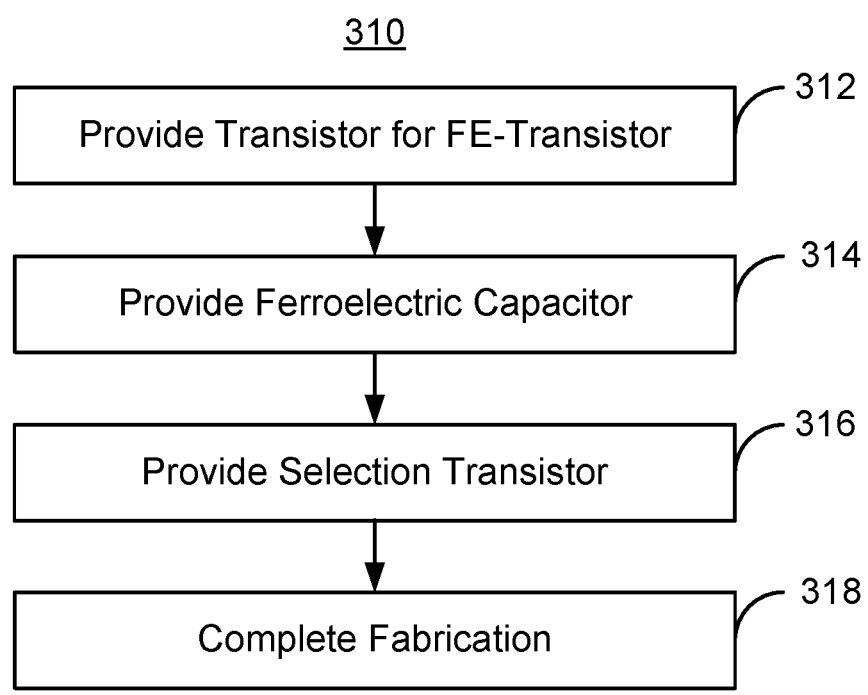
FIG. 4 is a flow chart depicting an exemplary embodiment of a method for fabricating an exemplary embodiment of the memory cell.

FIG. 4 is a flow chart depicting an exemplary embodiment of a method 310 for providing a memory cell 100, particularly as embedded memory in a logic device. For simplicity, some steps may be omitted, performed in another order and/or combined. The method 310 is also described in the context of the memory cell(s) 100. However, the method 300 may be used in connection with another memory cell. Further, the method 100 is discussed in the context of fabricating a single memory cell. Multiple memory cells are, however, generally formed together.

The transistor 112 for the FE-transistor 312 is provided, via step 312. For example, step 312 may include performing standard processing for the transistor 112 up to dummy gate deposition. A mask for regions of future transistors that leaves future resistor fins exposed may then be provided. Such a mask might be a photoresist mask or a hard mask. The resistor channel implant may be performed. For example, a low energy or plasma low-dose implant might be used. An oxide may be deposited over resistor regions and the device planarized. The mask over the transistor regions may be removed and standard CMOS processing resumed up to the M0 level. Thus, the transistor 112 might be formed in some embodiments.

The ferroelectric capacitor 114 is provided, via step 314. For example, for a MIM ferroelectric capacitor, step 314 might include depositing a first metal layer, depositing the ferroelectric material(s) such as $HfZrO_2$ as well as any other dielectric desired and depositing another metal layer. In some embodiments, each of these layers is nominally ten nanometers thick. Other thicknesses may be used in other embodiments. The capacitance is determined by the thickness of the ferroelectric layer (and any other dielectric layer(s)) between the metal layers. These layers may then be patterned to form the ferroelectric capacitor having the desired area. In other embodiments, other processes may be used.

The selection transistor 120 is also formed, via step 316. Step 316 and 312 may be combined in that the transistors 120 and 112 may be formed in the same layers of the device.

Fabrication of the memory cell and/or device in which the memory cell 100 resides may then be completed, via step 318.

Thus, using the method 310, the memory cells 100, array 150 and/or analogous device(s) may be fabricated. As a result, the advantages of one or more the memory cells 100 and/or analogous device may be achieved. A method and system for providing a compact memory cell that may be programmed at logic supply voltages mode has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A memory cell comprising:
   at least one ferroelectric transistor (FE-transistor) including a transistor and a ferroelectric capacitor for storing data, the ferroelectric capacitor including at least one ferroelectric material, the ferroelectric capacitor having an area of not more than $10^4$ nm$^2$;
   at least one selection transistor coupled with the FE-transistor.

2. The memory cell of claim 1 wherein the at least one FE-transistor consists of a FE-transistor and wherein the at least one selection transistor consists of a selection transistor, the transistor of the FE-transistor including a source, a drain and a gate coupled with the ferroelectric capacitor, the selection transistor including a selection transistor source, a selection transistor drain and a selection transistor gate, a write port of the memory cell being one of the selection transistor source and the selection transistor drain, an other of the selection transistor source and the selection transistor drain being coupled to the ferroelectric capacitor.

3. The memory cell of claim 2 wherein the FE-transistor is a FE-FET and wherein the ferroelectric capacitor is selected from a metal-insulator-metal (MIM) capacitor and a MIS (metal-insulator-semiconductor) capacitor integrated into the FE-FET.

4. The memory cell of claim 3 wherein the selection transistor is a finFET.

5. The memory cell of claim 2 wherein the memory cell includes a read port selected from the source and the drain of the transistor of the FE-transistor.

6. The memory cell of claim 2 wherein the memory cell is integrated into a logic die having a logic supply voltage and wherein the FE-transistor is configured to switched using a switching voltage not more than the logic supply voltage.

7. The memory cell of claim 2 wherein the at least one ferroelectric material includes at least one of doped HfO$_2$ and PbZrTi.

8. A semiconductor device comprising:
   a plurality of memory cells, each of the plurality of memory cells including at least one ferroelectric transistor (FE-transistor) and at least one selection transistor coupled with the FE-transistor, the FE-transistor including a transistor and a ferroelectric capacitor for storing data, the ferroelectric capacitor including at least one ferroelectric material; and
   a plurality of selection lines coupled with the plurality of memory cells, the ferroelectric capacitor having an area of not more than $10^4$ nm$^2$.

9. The semiconductor device of claim 8 wherein the at least one FE-transistor consists of a FE-transistor and wherein the at least one selection transistor consists of a selection transistor, the transistor of the FE-transistor including a source, a drain and a gate coupled with the ferroelectric capacitor, the selection transistor including a selection transistor source, a selection transistor drain and a selection transistor gate, a write port of the memory cell being one of the selection transistor source and the selection transistor drain, an other of the selection transistor source and the selection transistor drain being coupled to the ferroelectric capacitor.

10. The semiconductor device of claim 9 further comprising:
    a plurality of logic devices coupled with the plurality of memory cells such that the semiconductor device is a logic die having a logic supply voltage, the plurality of memory cells being on-die memory for the plurality of logic devices and being programmed using a programming voltage not exceeding the logic supply voltage.

11. The semiconductor device of claim 9 wherein the FE-transistor is a FE-FET and wherein the ferroelectric capacitor is selected from a metal-insulator-metal (MIM) capacitor and a metal-insulator-semiconductor (MIS) capacitor integrated onto the transistor.

12. The semiconductor device of claim 9 wherein selection transistor is a finFET.

13. The semiconductor device of claim 9 wherein each of the plurality of memory cells includes a read port selected from the source and the drain of the transistor of the FE-transistor.

14. A method for operating a memory cell comprising:
    programming the memory cell, the memory cell including a ferroelectric transistor (FE-transistor) and a selection transistor coupled with the FE-transistor, the FE-transistor including a transistor and a ferroelectric capacitor for storing data, the ferroelectric capacitor including at least one ferroelectric material, the transistor of the FE-transistor including a source, a drain and a gate coupled with the ferroelectric capacitor, the selection transistor including a selection transistor source, a selection transistor drain and a selection transistor gate, a write port of the memory cell being selected from the selection transistor source and the selection transistor drain, the step of programming the memory cell including
    providing a selection signal to the selection transistor gate of the memory cell, the selection signal being not more than a logic supply voltage;
    providing a program voltage to the write port while the source and drain of the transistor of the FE-transistor are at ground, the program voltage being not more than the logic supply voltage; and
    erasing the memory cell before the selection signal providing step and the program voltage providing step, the erasing step further including providing a high voltage to the source and drain of the transistor of the FE-FET.

15. The method of claim 14 further comprising:
    reading the memory cell, the memory cell including a read port selected from the source and the drain of the transistor of the FE-transistor, the step of reading the memory cell further including determining a voltage on the read port.

16. The method of claim 14 wherein the high voltage is substantially the logic supply voltage.

17. The method of claim 14 wherein the programming step uses non-negative voltages.

18. A method for operating a memory cell comprising:
programming the memory cell, the memory cell including a ferroelectric transistor (FE-transistor) and a selection transistor coupled with the FE-transistor, the FE-transistor including a transistor and a ferroelectric capacitor for storing data, the ferroelectric capacitor including at least one ferroelectric material, the transistor of the FE-transistor including a source, a drain and a gate coupled with the ferroelectric capacitor, the selection transistor including a selection transistor source, a selection transistor drain and a selection transistor gate, a write port of the memory cell being selected from the selection transistor source and the selection transistor drain, the step of programming the memory cell including
providing a selection signal to the selection transistor gate of the memory cell, the selection signal being not more than a logic supply voltage; and
providing a program voltage to the write port while the source and drain of the transistor of the FE-transistor are at ground, the program voltage being not more than the logic supply voltage;
wherein the programming step uses pulse widths of at least $10^{-4}$ seconds and not more than $10^{-1}$ seconds.

19. The memory cell of claim 1, wherein the area of the ferroelectric capacitor is least $10^2$ nm$^2$.

20. The semiconductor device of claim 8, wherein area of the ferroelectric capacitor is at least $10^2$ nm$^2$.

* * * * *